(12) United States Patent
Lee (10) Patent No.: US 10,663,811 B2
(45) Date of Patent: *May 26, 2020

(54) DISPLAY DEVICE AND RELATED MANUFACTURING METHOD

(71) Applicant: SAMSUNG DISPLAY CO., LTD., Yongin-si, Gyeonggi-do (KR)

(72) Inventor: Misun Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/056,529

(22) Filed: Aug. 7, 2018

(65) Prior Publication Data

US 2018/0341136 A1    Nov. 29, 2018

Related U.S. Application Data

(63) Continuation of application No. 15/786,390, filed on Oct. 17, 2017, now Pat. No. 10,067,388.

(30) Foreign Application Priority Data

Oct. 19, 2016 (KR) .................... 10-2016-0135881

(51) Int. Cl.
| | |
|---|---|
| G02F 1/1345 | (2006.01) |
| G02F 1/1343 | (2006.01) |
| H01L 27/12 | (2006.01) |
| G02F 1/13 | (2006.01) |
| G02F 1/136 | (2006.01) |
| G02F 1/1362 | (2006.01) |

(Continued)

(52) U.S. Cl.
CPC ............ *G02F 1/1343* (2013.01); *G02F 1/136* (2013.01); *G02F 1/1309* (2013.01); *G02F 1/1345* (2013.01); *G02F 1/136286* (2013.01); *H01L 27/124* (2013.01); *H01L 29/786* (2013.01); *G02F 2001/133374* (2013.01)

(58) Field of Classification Search
None
See application file for complete search history.

(56) References Cited

U.S. PATENT DOCUMENTS

| | | |
|---|---|---|
| 5,361,150 A | 11/1994 | Noguchi |
| 6,650,394 B1 | 11/2003 | Kim et al. |

(Continued)

FOREIGN PATENT DOCUMENTS

| | | |
|---|---|---|
| KR | 10-2001-0025863 | 4/2001 |
| KR | 2002-0004772 | 1/2002 |

(Continued)

*Primary Examiner* — James A Dudek
(74) *Attorney, Agent, or Firm* — Innovation Counsel LLP (57) ABSTRACT

A display device may include a substrate, a plurality of gate lines and a plurality of data lines, gate wirings and data wirings. The substrate may comprise a display area in which a plurality of pixels for displaying an image are arranged and a non-display area around the display area. The plurality of gate lines and the plurality of data lines in the display area on the substrate, the plurality of gate lines extending in one direction and the plurality of data lines extending in a direction intersecting said one direction. The gate wirings and data wirings in the non-display area on the substrate. At least one of the gate wirings and the data wirings has a hole having an edge in the form of numbers.

21 Claims, 12 Drawing Sheets

(51) Int. Cl.
    *H01L 29/786*     (2006.01)
    *G02F 1/1333*     (2006.01)

(56) References Cited

U.S. PATENT DOCUMENTS

| | | | |
|---|---|---|---|
| 6,667,792 B2 | 12/2003 | Park et al. | |
| 6,734,931 B2 | 5/2004 | Yu | |
| 8,582,073 B2 | 11/2013 | Yamazaki | |
| 10,067,388 B2* | 9/2018 | Lee | G02F 1/1345 |
| 2003/0225473 A1 | 12/2003 | Yamazaki | |
| 2017/0097539 A1* | 4/2017 | Yanagisawa | G02F 1/136209 |

FOREIGN PATENT DOCUMENTS

| | | |
|---|---|---|
| KR | 2003-0076901 | 9/2003 |
| KR | 10-0483386 | 8/2005 |

* cited by examiner

DISPLAY DEVICE AND RELATED MANUFACTURING METHOD

CROSS-REFERENCE TO RELATED APPLICATION

This application is a continuation of U.S. patent application Ser. No. 15/786,390, filed on Oct. 17, 2017 and claims priority under 35 U.S.C. § 119 to Korean Patent Application No. 10-2016-0135881, filed on Oct. 19, 2016, in the Korean Intellectual Property Office (KIPO); the disclosure of the Korean Patent Application is incorporated by reference herein in its entirety.

BACKGROUND

1. Technical Field

The technical field relates to a display device, and more particularly, to a display device including a narrow bezel.

2. Discussion of Related Art

Display devices may include liquid crystal display (LCD) devices, organic light emitting diode (OLED) display devices, plasma display panel (PDP) devices, and electrophoretic display devices.

A display device may include a display area in which a plurality of pixels for displaying an image are arranged and may include a non-display area around the display area. The non-display area may include wirings and/or drivers. In addition, the non-display area may include a space for displaying line numbers of gate lines and data lines in order to identify defects that may occur during the process of manufacturing the display device and to perform repairing.

This background section is intended to provide useful information for understanding technology related to this application. The background section may include ideas, concepts, and/or information that are not known or appreciated by those skilled in the pertinent art prior to an effective filing date of this application.

SUMMARY

Embodiments may be directed to a display device including a narrow bezel.

According to an embodiment, a display device may include the following elements: a substrate comprising a display area in which a plurality of pixels for displaying an image are arranged and a non-display area abutting the display area; a plurality of gate lines and a plurality of data lines in the display area on the substrate, the plurality of gate lines extending in one direction and the plurality of data lines extending in a direction intersecting said one direction; and gate wirings and data wirings in the non-display area on the substrate. At least one of the gate wirings and the data wirings has a hole having an edge in the form representing multiple numbers.

At least one of the gate wirings and the data wirings has a hole having an edge in the form representing symbols, letters and patterns.

The gate wiring may be formed in a substantially same process as a process in which the gate line is formed.

The data wiring may be formed in a substantially same process as a process in which the data line is formed.

The numbers represent an identification line number of the gate line and the data line.

The symbol, the letter and the pattern may represent an identification line number of the gate line and the data line.

The symbol, the letter and the pattern represent an ascending direction or a descending direction of an identification line number of the gates line and the data lines.

The gate wiring may be a part of one of a driving signal wiring, a power application wiring, an antistatic wiring, an inspection wiring and a repair wiring.

The data wiring may be a part of one of a driving signal wiring, a power application wiring, an antistatic wiring, an inspection wiring and a repair wiring.

The gate wiring may include a gate fan-out wiring connected to the gate line.

The hole may be positioned adjacent to the gate fan-out wiring.

The data wiring may include a data fan-out wiring connected to the data line.

The hole may be positioned adjacent to the data fan-out wiring.

DETAILED DESCRIPTION

Embodiments are described with reference to the accompanying drawings. Practical embodiments are not limited to the described embodiments. Practical embodiments include all practical changes, equivalents, and substitutions to the described embodiments.

In the drawings, thicknesses layers and areas are illustrated in an enlarged manner for clarity and ease of description.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. The spatially relative terms "below", "beneath", "lower", "above", "upper" and the like, may be used herein for ease of description to describe the relations between one element and another element as illustrated in the drawings. The spatially relative terms are intended to encompass different orientations of the device in use or operation, in addition to the orientation depicted in the drawings. For example, in the case where a device illustrated in the drawing is turned over, a first element positioned "below" or "beneath" a second element may be placed "above" the second element. Accordingly, the illustrative term "below" may include both the lower and upper positions. The device may also be oriented in the other direction and thus the spatially relative terms may be interpreted differently depending on the orientations.

The term "connect" may mean "directly connect", "indirectly connect", and/or "electrically connect". The terms "comprises," "including," "includes" and/or "including," may specify the presence of stated features, integers, steps, operations, elements, and/or components, but may not preclude the presence or addition of one or more other features, integers, steps, operations, elements, components and/or groups. The term "conductive" may mean "electrically conductive".

"About" or "approximately" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this application pertains. Terms, such as those defined in commonly used dictionaries, should be interpreted as having a meaning that is consistent with their meaning in the context of the relevant art and will not be interpreted in an ideal or excessively formal sense unless clearly defined in the present specification.

Like reference numerals may refer to like elements.

A display device according to one or more embodiments may be, for example, an LCD device, an OLED display device, or a plasma display device.

Figure 1:
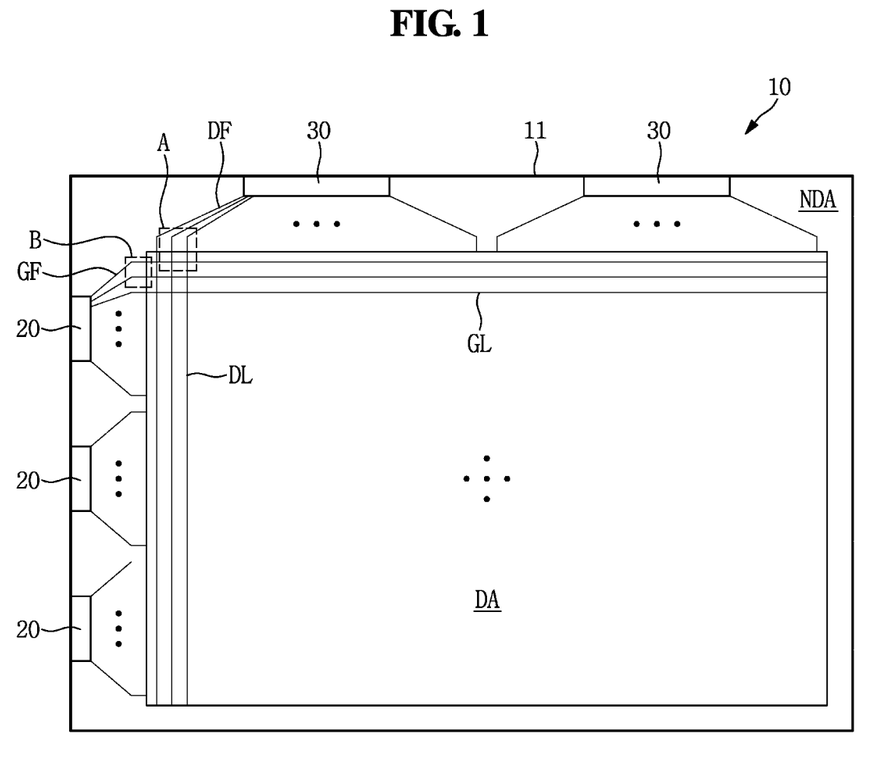
FIG. 1 is a plan view schematically illustrating a conventional display device.
Figure 2:
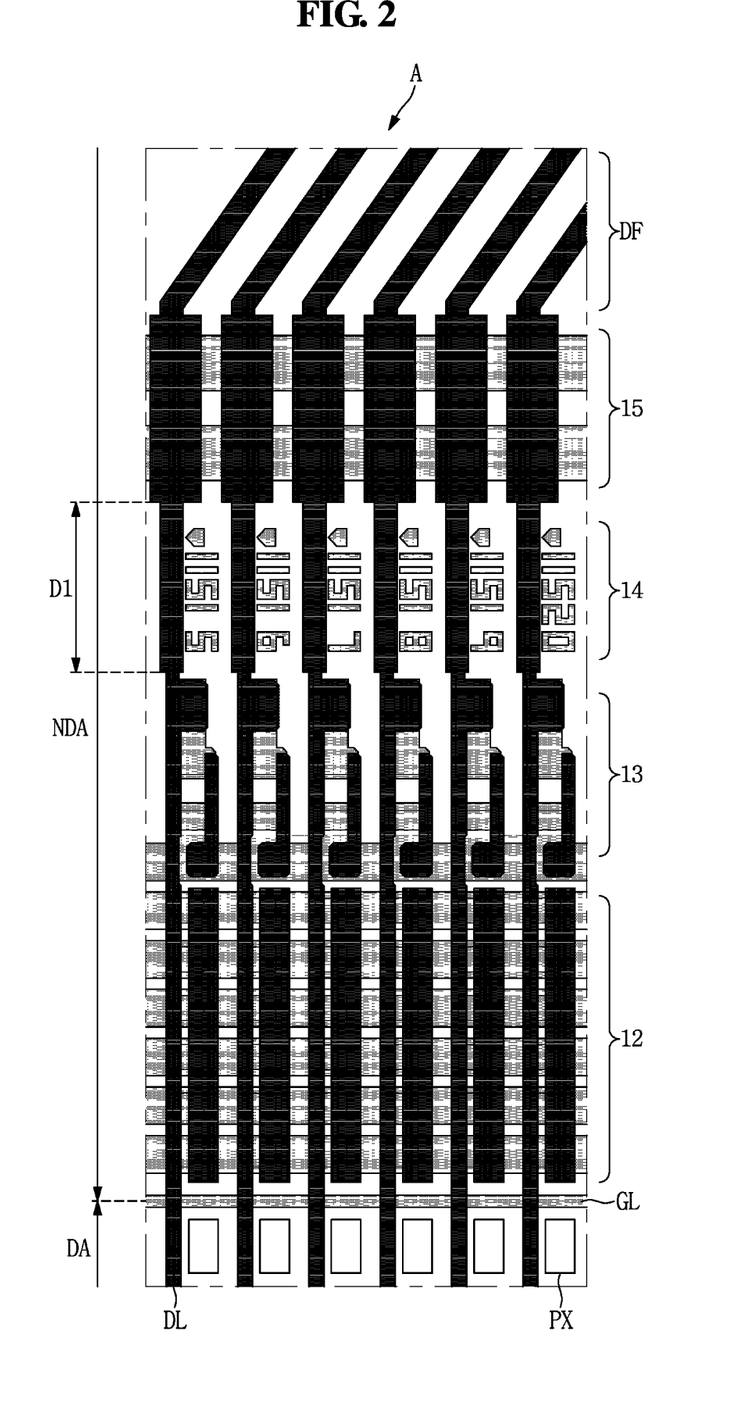
FIG. 2 is a partial enlarged view illustrating an area "A" of FIG. 1.
Figure 3:
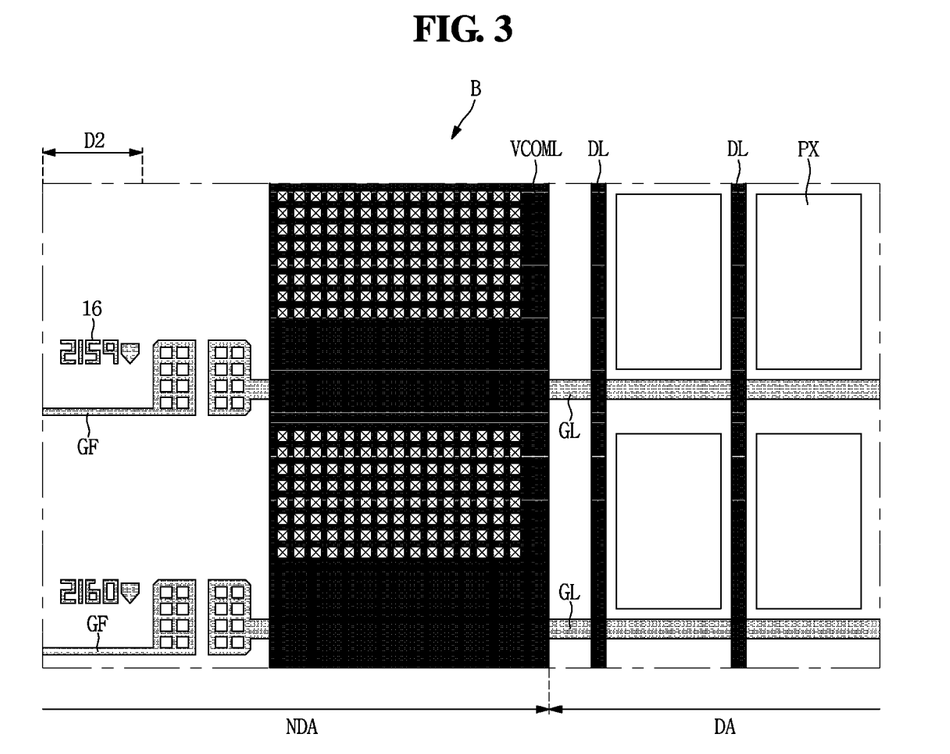
FIG. 3 is a partial enlarged view illustrating an area "B" of FIG. 1.

FIG. 1 is a plan view schematically illustrating a conventional display device, FIG. 2 is a partial enlarged view illustrating an area "A" of FIG. 1, and FIG. 3 is a partial enlarged view illustrating an area "B" of FIG. 1.

Referring to FIGS. 1, 2, and 3, a conventional display device 10 may include a substrate 11, the substrate 11 including a display area DA in which a plurality of pixels PX for displaying an image are arranged and a non-display area NDA around the display area DA; a plurality of gate lines GL and a plurality of data lines DL in the display area DA on the substrate 11, the plurality of gate lines GL extending in one direction and the plurality of data lines DL extending in a direction intersecting said one direction; and a plurality of gate driver integrated circuits ("ICs") 20 and a plurality of data driver ICs 30 in the non-display area NDA on the substrate 11.

In addition, in the conventional display device 10, various wirings such as an antistatic circuit wiring, a repair wiring and an inspection circuit wiring, as well as a driving signal wiring and a power application wiring for driving pixels, may be integrated in the non-display area NDA on the substrate 11.

FIG. 2 is a view illustrating a portion of the non-display area NDA in which the data driver IC 30 is disposed in the display device 10 of FIG. 1, and FIG. 3 is a view illustrating a portion of the non-display area NDA of the display device 10 in which the gate driver IC 20 is disposed.

Referring to FIG. 2, the conventional display device 10 may include antistatic circuit units 12 and 13, a data line number indicating portion 14, a repair wiring 15, a data fan-out wiring DF, and the like in an upper portion of the non-display area NDA.

In addition, referring to FIG. 3, the conventional display device 10 may include a gate fan-out wiring GF connected to the gate line GL, a gate line number indicating portion 16, a common voltage wiring VCOML, and the like in left and right portions of the non-display area NDA.

Referring to FIGS. 2 and 3, the conventional display device 10 may include areas 14 and 16 in the non-display area NDA at which line numbers of the gate line GL and the data line DL are indicated in order to check for defects that may occur during the process of manufacturing the display device 10 and to proceed with repairing.

For a UHD (ultra-high-definition) class display device, a horizontal resolution is 3,840, and thus a minimum of five digits from 1 to 11,520 is required to indicate the data line numbers. Considering the resolution of the conventional exposure apparatus, widths D1 and D2 of at least about 100 µm is required for displaying the five-digit numbers.

Figure 4:
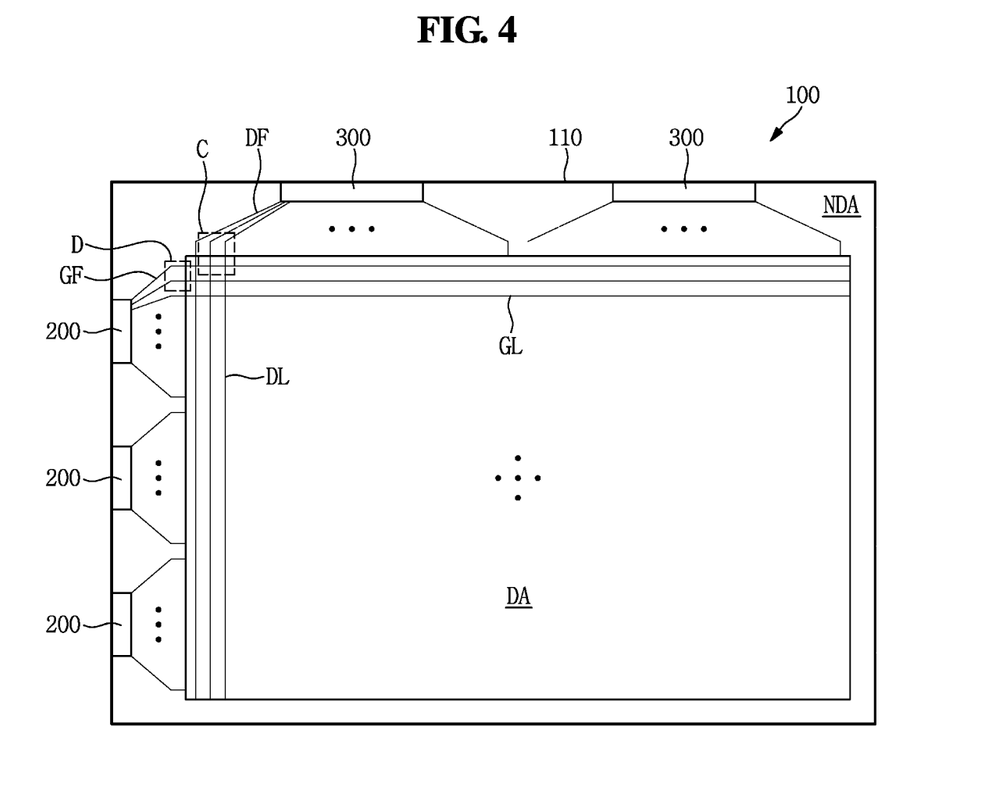
FIG. 4 is a plan view schematically illustrating a display device according to an embodiment.
Figure 5:
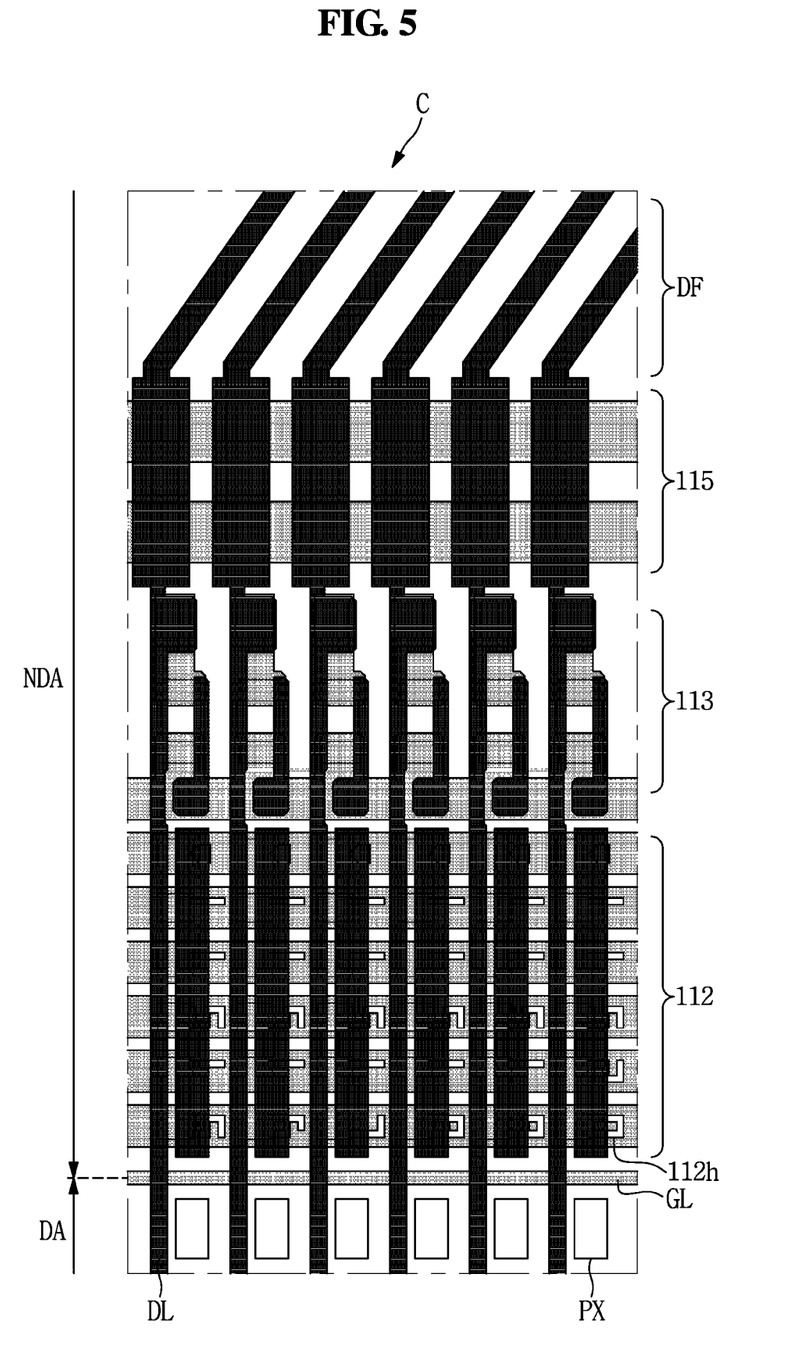
FIG. 5 is a partial enlarged view illustrating an area "C" of FIG. 4 according to an embodiment.
Figure 6:
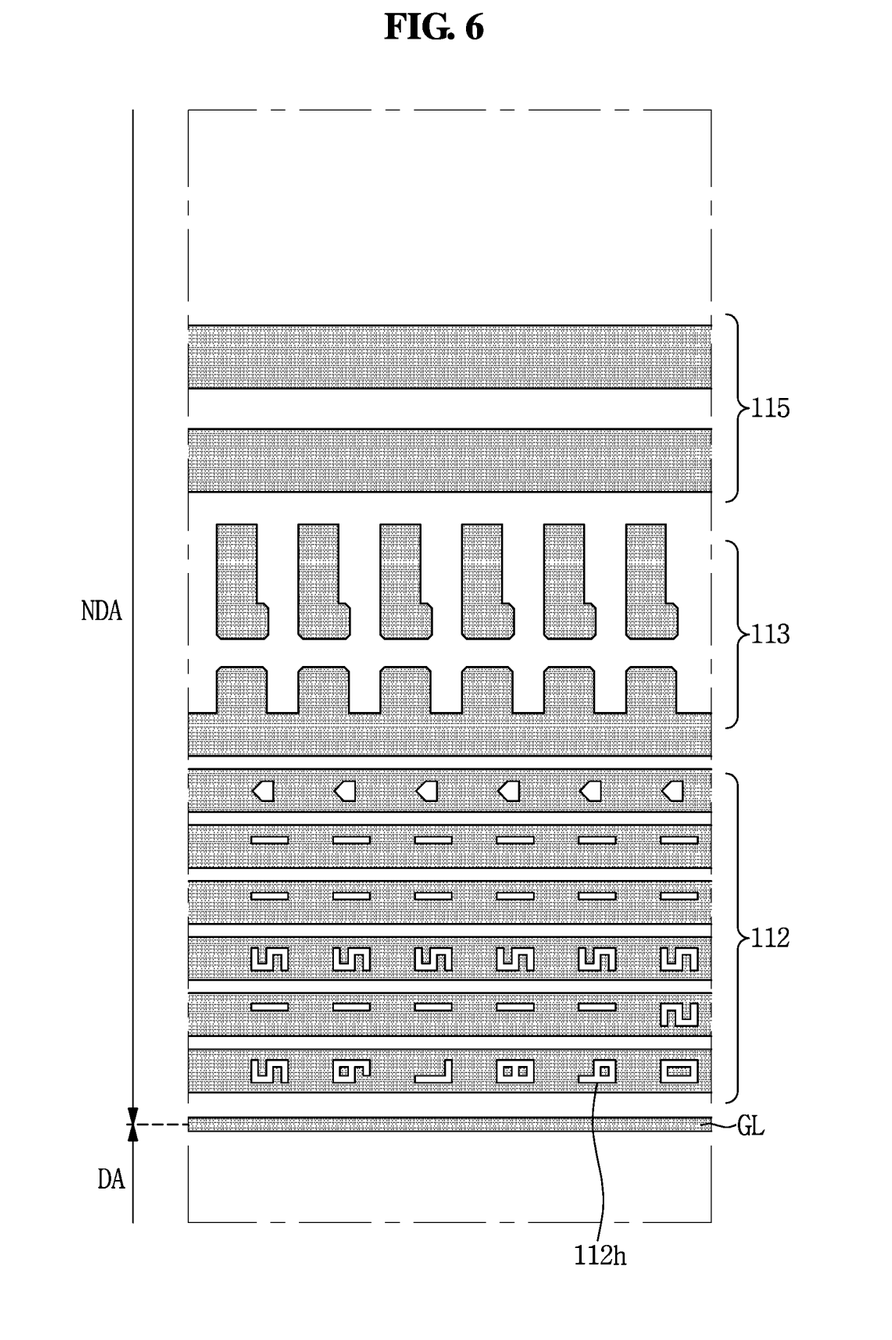
FIG. 6 is a plan view illustrating a gate wiring of FIG. 5 according to an embodiment.

FIG. 4 is a plan view schematically illustrating a display device according to an embodiment, FIG. 5 is a partial enlarged view illustrating an area "C" of FIG. 4 according to an embodiment, and FIG. 6 is a plan view illustrating a gate wiring of FIG. 5 according to an embodiment.

Referring to FIGS. 4, 5, and 6, a display device 100 may include a substrate 110, the substrate 110 including a display area DA in which a plurality of pixels PX for displaying an image are arranged and a non-display area NDA around the display area DA; a plurality of gate lines GL and a plurality of data lines DL in the display area DA on the substrate 11, the plurality of gate lines GL extending in one direction and being electrically connected to the pixels PX, and the plurality of data lines DL extending in a direction intersecting said one direction and being electrically connected to the pixels PX; and a plurality of gate driver ICs 200 and a plurality of data driver ICs 300 in the non-display area NDA on the substrate 110.

In addition, in the display device 100, various wirings such as an antistatic circuit wiring, a repair wiring and an inspection circuit wiring, as well as a driving signal wiring and a power application wiring for driving pixels, may be integrated in the non-display area NDA on the substrate 110.

FIG. 5 is a view illustrating a portion of the non-display area NDA in which the data driver IC 300 is disposed in the display device 100 of FIG. 4. Referring to FIG. 5, the display device 100 may include antistatic circuit units 112 and 113, a repair wiring 115, a data fan-out wiring DF, and the like in an upper portion of the non-display area NDA.

The antistatic circuit units 112 and 113 and the repair wiring 115 may be formed by combination of a gate wiring (formed in the non-display area NDA in a substantially same process as a process in which the gate line GL is formed) and a data wiring (formed in the non-display area NDA in a substantially same process as a process in which the data line DL is formed).

The data lines DL in the display area DA may be connected to the antistatic circuit units 112 and 113 in the non-display area NDA.

The antistatic circuit units 112 and 113 may be positioned between the data driver IC 300 and the data lines DL and may substantially protect the pixels PX from static electricity flowing to the data lines DL during driving of the display device 100 or in the process of manufacturing the display device 100.

The antistatic circuit units 112 and 113 may include an electrostatic transistor unit 112 and an electrostatic diode unit 113. The electrostatic diode unit 113 may disperse current flowing into the data lines DL, and the electrostatic transistor unit 112 may store the remaining static electricity in each of the data lines DL and may be broken instead of a driving thin film transistor (TFT) in the display area DA.

The electrostatic transistor unit 112 may be a small TFT, e.g., a "tick" TFT. The electrostatic transistor unit 112 may receive a gate voltage from at least one of power apply lines or signal lines in the non-display area NDA to be turned off.

The repair wiring 115 is a wiring for short-circuiting a data line if a failure occurs in the process of manufacturing the display device 100. In case defects occur in the process, a laser beam may be irradiated to connect a suitable portion of the repair wiring 115 to a defective data line DL.

The data fan-out wiring DF may connect the data driver IC 300 with the data lines DL. The data fan-out wiring DF may be formed in a zigzag shape to substantially prevent an RC delay deviation depending on the length between the respective data lines DL and the data driver IC 300.

It is depicted in FIG. 5 that the antistatic circuit units 112 and 113, the repair wiring 115, and the data fan-out wiring DF are disposed in the upper portion of the non-display area NDA in the display device 100. In embodiments, various wirings for driving the display device 100, such as a driving signal wiring, a power application wiring, and an inspection circuit wiring, may be integrated in the upper portion of the non-display area NDA in the display device 100.

In this application, among the various wirings arranged in the non-display area NDA, a wiring formed in substantially the same process and of substantially the same material(s) as the gate lines GL is referred to as a gate wiring, and a wiring formed in substantially the same process and of substantially the same material(s) as the data lines DL is referred to as a data wiring.

In the display device 100, at least one of the gate wiring and the data wiring arranged in the non-display area NDA may have a hole having (one or more edges forming) at least one of a numerical shape (or numeral shape representing numbers), a symbol shape, a letter shape, and a pattern shape.

In the display device 100, at least one of the gate wiring and the data wiring in the non-display area NDA may have a number/numeral, a symbol, a letter, and/or a pattern in an engraved form. The letter and the pattern may include bar codes, QR codes, and the like.

The gate wiring and/or the data wiring may have multiple holes having forms representing multiple numbers, symbols, letters, and/or patterns. The numbers, symbols, letters, and/or patterns may display various information related to the display device 100. For example, gate line identification numbers, data line identification number, and/or an ascending or descending direction of the gate line identification numbers and/or the data line identification numbers may be displayed and/or indicated. The ascending/increasing direction or the descending/decreasing direction of the gate line identification numbers and/or the data line identification numbers may be represented by an arrow-shaped symbol or the like.

Referring to FIGS. 5 and 6, in the display device 100, the plurality of gate wirings constituting the electrostatic transistor unit 112, among the various wirings arranged in the non-display area NDA, may have a hole 112h having an edge in the form representing a number and/or symbol. In embodiments, the gate wiring constituting the electrostatic diode unit 113 or the repair wiring 115 may have a hole having an edge that has a numerical shape.

Numbers, symbols, letters, and patterns represented by the holes 112h may be arranged in parallel with an adjacent one of the data lines DL to indicate the corresponding data line identification number. Advantageously, if a defect occurs in a data line DL in the process of manufacturing the display device 100, the repair process may be easily performed using the corresponding line identification number.

Since the data line identification numbers are displayed using the gate wiring of the electrostatic transistor unit 112 which is a conventional structure, no additional space for displaying the data line identification numbers may be necessary. Advantageously, the width of the non-display area NDA may be minimized, and/or the width of various wirings arranged in the non-display area NDA may be maximized in the display device 100.

Figure 7:
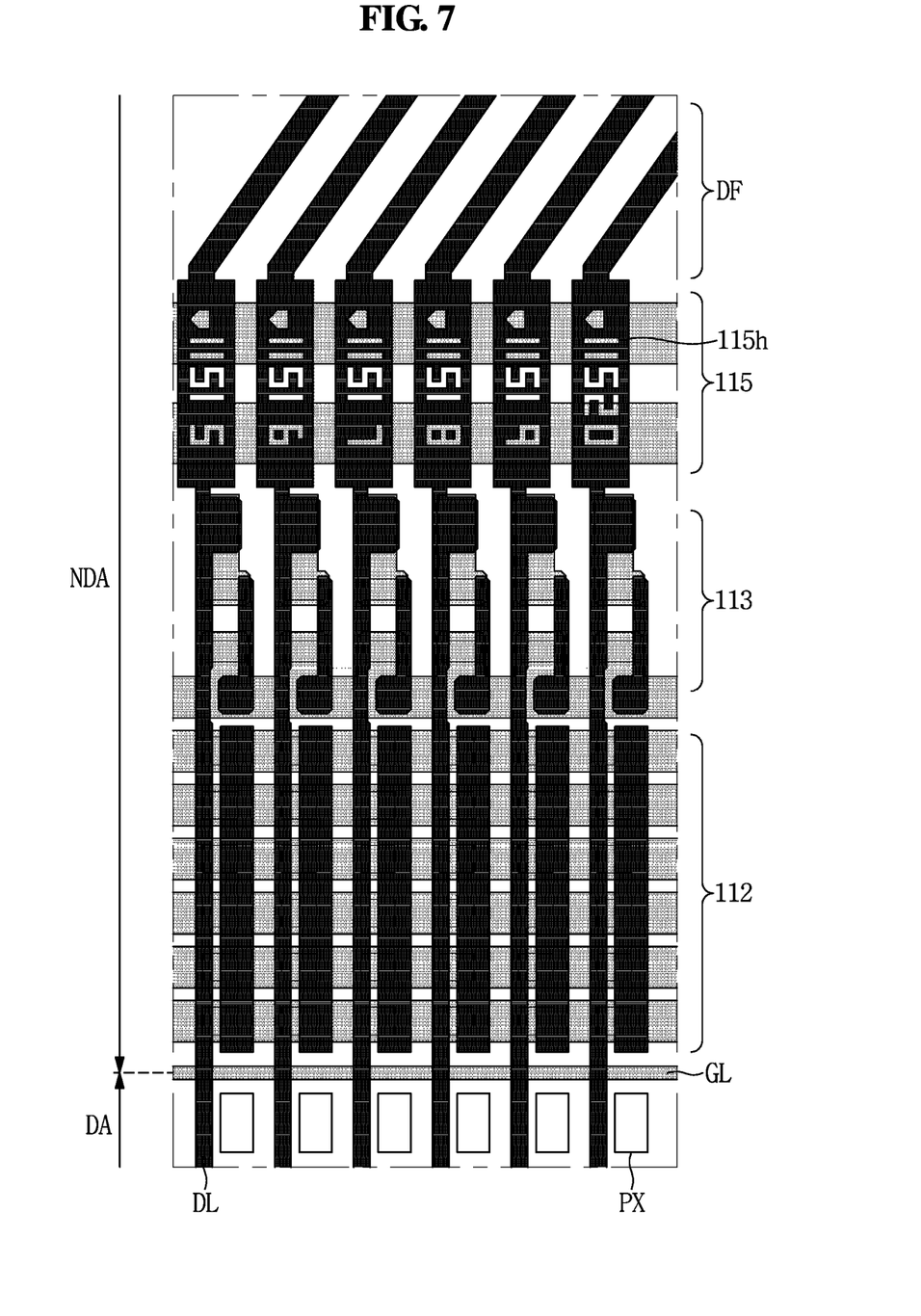
FIG. 7 is a plan view illustrating a non-display area according to an embodiment.
Figure 8:
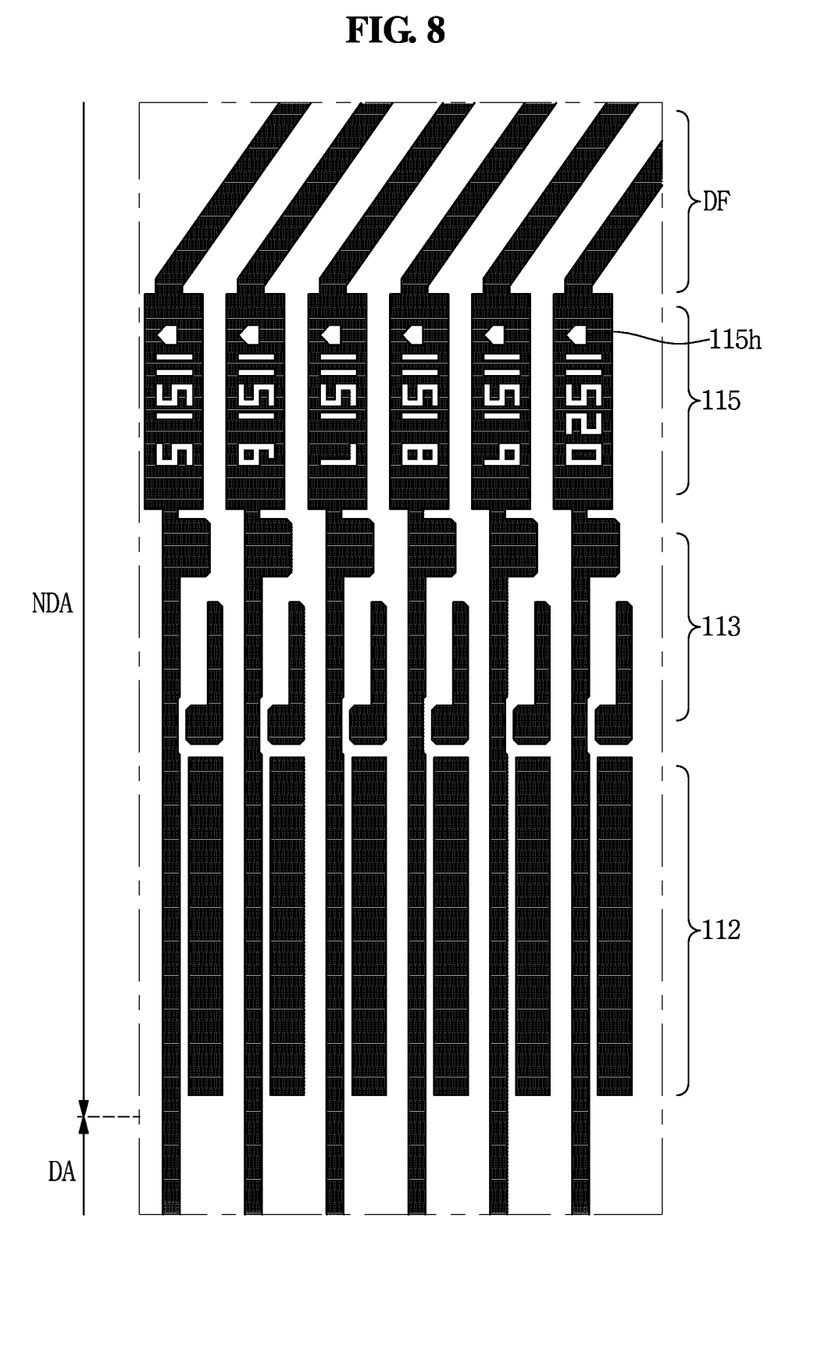
FIG. 8 is a plan view illustrating a data wiring of FIG. 7 according to an embodiment.

FIG. 7 is a plan view illustrating a non-display area NDA according to an embodiment, and FIG. 8 is a plan view illustrating a data wiring of FIG. 7.

Referring to FIGS. 7 and 8, in a display device 100, a data wiring constituting a repair wiring 115, among various wirings arranged in a non-display area NDA, may have a hole 115h having an edge in the form representing a number and/or symbol. In embodiments, the data wiring constituting the electrostatic transistor unit 112 or the electrostatic diode unit 113 may have a hole having an edge that has a numerical shape.

Numbers, symbols, letters, and patterns represented by the holes 115h may indicate one or more corresponding data line identification numbers. Advantageously, if a defect occurs in a data line DL, the repair process may be easily performed using the corresponding line identification number.

Since the data line numbers is displayed using the data wiring of the repair wiring 115 which is a conventional structure, no additional space for displaying the data line numbers may be required. Advantageously, the width of the non-display area NDA may be minimized and/or the width of various wirings arranged in the non-display area NDA may be maximized in the display device 100.

Figure 9:
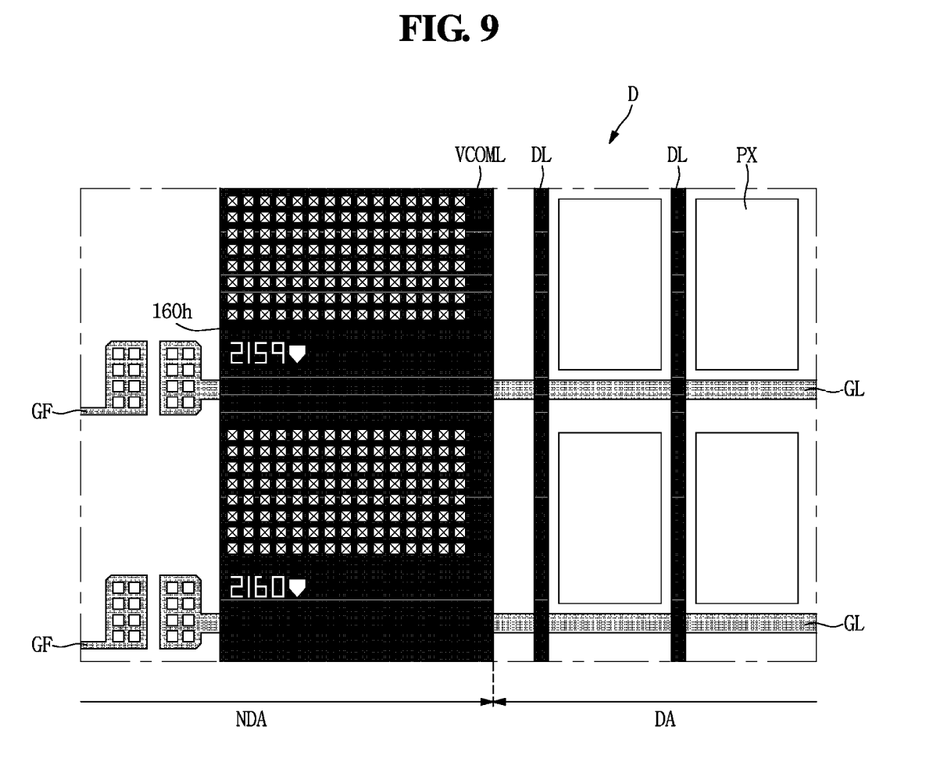
FIG. 9 is a partial enlarged view illustrating an area "D" of FIG. 4 according to an embodiment.
Figure 10:
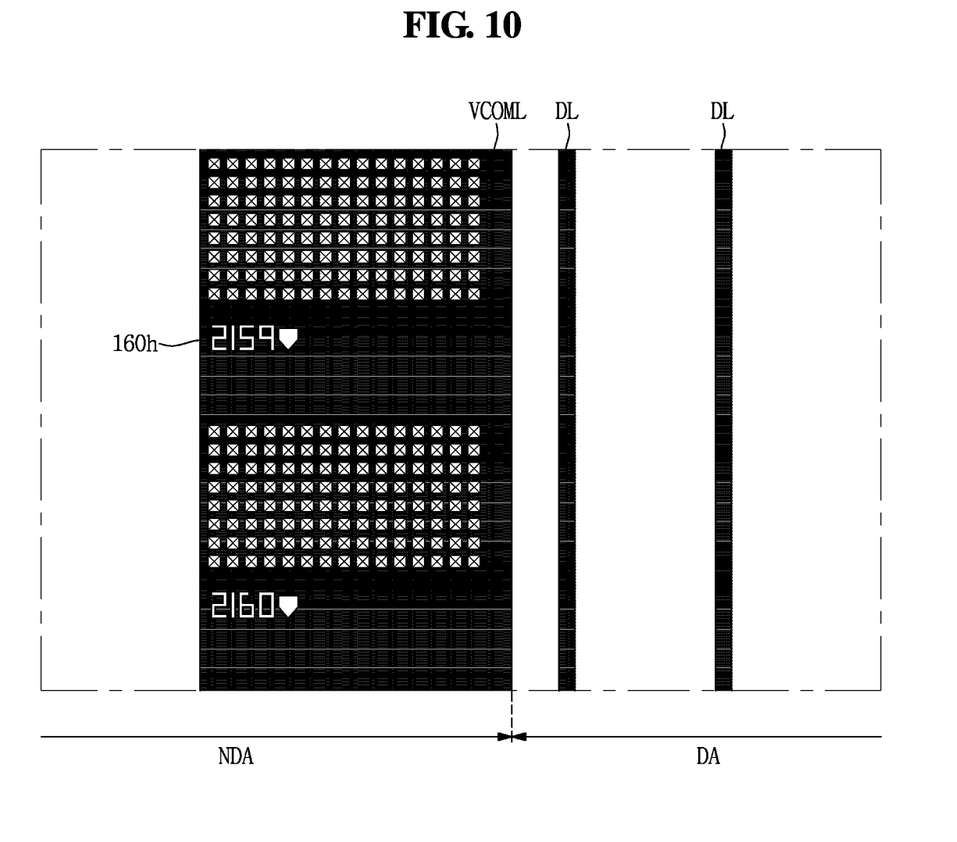
FIG. 10 is a plan view illustrating a data wiring of FIG. 9 according to an embodiment.

FIG. 9 is a partial enlarged view illustrating an area "D" of FIG. 4, and FIG. 10 is a plan view only illustrating a data wiring of FIG. 9.

Referring to FIGS. 9 and 10, a display device 100 may include a gate fan-out wiring GF, a common voltage wiring VCOML, and the like in left and right portions of a non-display area NDA. In embodiments, various wirings for driving the display device 100, such as a driving signal wiring and a power application wiring, may be integrated in the left and right portions of the non-display area NDA in the display device 100.

In the display device 100, the common voltage wiring VCOML, among various wirings arranged in the non-display area NDA, may have a hole 160h having an edge in the form representing a number and/or symbol.

Numbers, symbols, letters, and patterns represented by the holes 160h may be arranged in parallel with an adjacent one of the gate lines GL to indicate the corresponding gate line identification number. Advantageously, if a defect occurs in a gate line GL, the repair process may be easily performed using the corresponding line identification number.

Since the gate line number is displayed using the common voltage wiring VCOML which is a conventional structure, no additional space for displaying the gate line number may be required. Advantageously, the width of the non-display area NDA may be minimized and/or the width of various wirings arranged in the non-display area NDA may be maximized in the display device 100.

Figure 11:
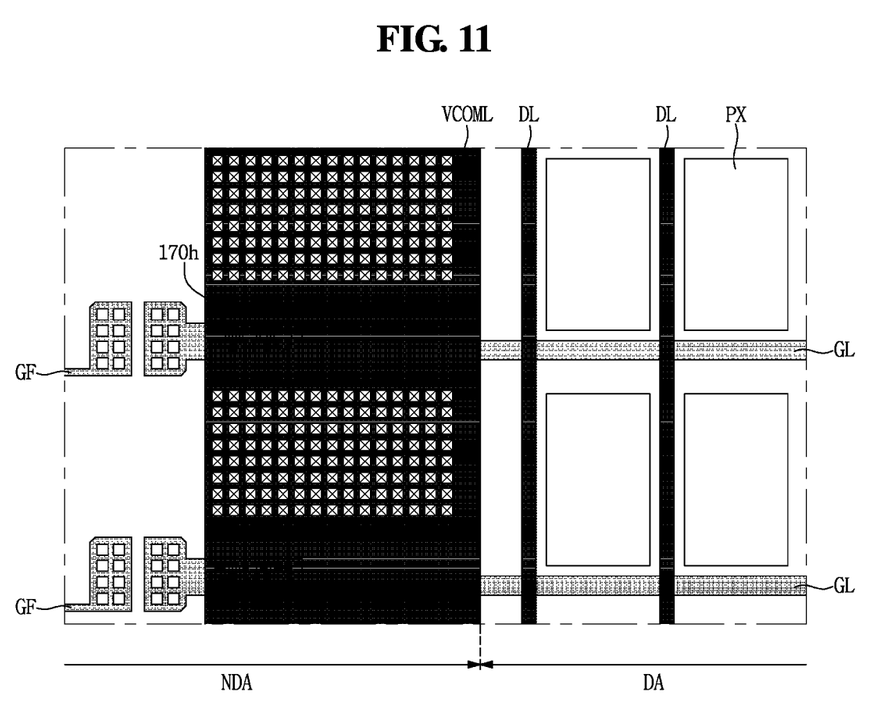
FIG. 11 is a plan view illustrating a non-display area according to an embodiment.
Figure 12:
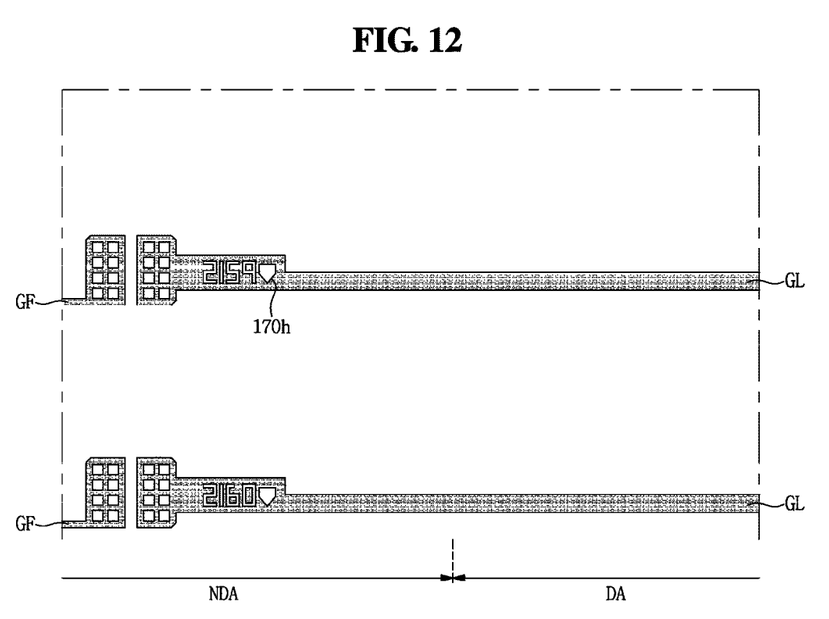
FIG. 12 is a plan view illustrating a gate wiring of FIG. 11 according to an embodiment.

FIG. 11 is a plan view illustrating a non-display area according to an embodiment, and FIG. 12 is a plan view illustrating a gate wiring of FIG. 11.

Referring to FIGS. 11 and 12, in a display device 100, a gate line GL, among various wirings in a non-display area NDA, may have a hole 170h having an edge in the form representing numbers and symbols.

Numbers, symbols, letters, and patterns represented by the holes 170h may indicate corresponding gate line identification numbers. Advantageously, if a defect occurs in a gate line GL, the repair process may be easily performed using the corresponding line identification number.

Since the gate line number is displayed at the gate line GL per se, no additional space for displaying the gate line number may be necessary. Advantageously, the width of the non-display area NDA may be minimized and/or the width of various wirings arranged in the non-display area NDA may be maximized in the display device 100.

As set forth hereinabove, according to one or more embodiments, space for displaying the line identification numbers of the gate lines and the data lines may be saved by indicating the line identification numbers of the gate lines and the data lines in an engraved form on various wirings in the non-display area of the display device.

Advantageously, it is possible to minimize the width of the non-display area in the display device and/or to maximize the width of the various wirings in the non-display area.

While example embodiments have been illustrated and described, various changes in form and detail may be implemented without departing from the spirit and scope defined by the claims.

What is claimed is:

1. A display device comprising:
    a substrate comprising a display area and a non-display area, the non-display area abutting the display area;
    a plurality of pixels positioned on the display area for displaying an image;
    a first conductive line positioned on the display area and electrically connected to one or more of the pixels; and
    a first conductive member electrically connected to the first conductive line, positioned on the non-display area, and having a first hole,
    wherein a material of the first conductive member is identical to a material of the first conductive line,
    wherein the first hole has a form of a first numeral, and
    wherein the first numeral represents a first number in a range of 2 to 9.

2. The display device of claim 1, wherein the first conductive member has a second hole, wherein the second hole has a form of a second numeral, wherein the second numeral represents a second number in the range of 2 to 9, and wherein a difference between the second number and the first number is 0 or 1.

3. The display device of claim 2, wherein the second hole neighbors the first hole with no intervening hole of the first conductive member being positioned between the first hole and the second hole.

4. The display device of claim 1, wherein the first conductive line extends in a first direction, wherein the first conductive member has a second hole, wherein the second hole is aligned with the first hole in a direction parallel to the first direction and has a form of a second numeral, and wherein the second numeral represents a second number in the range of 2 to 9.

5. The display device of claim 1 comprising a second conductive line intersecting the first conductive line, electrically isolated from the first conductive line, and electrically connected to at least one of the pixels, wherein the first number represents a digit of an identification number of the first conductive line or a digit of an identification number of the second conductive line.

6. The display device of claim 1, wherein the first conductive line extends in a first direction, and wherein a width of the first conductive line in the first direction is smaller than a dimension of the first hole in the first direction.

7. The display device of claim 1 comprising an electrostatic diode, wherein the first hole is positioned between the first conductive line and the electrostatic diode.

8. The display device of claim 1, wherein the first conductive member is a part of one of a driving signal wiring, a power application wiring, an antistatic wiring, an inspection wiring and a repair wiring.

9. The display device of claim 1 comprising a driver integrated circuit, wherein the first conductive line is electrically connected through two portions of the first conductive member to the driver integrated circuit, and wherein the first hole is positioned between the two portions of the first conductive member.

10. The display device of claim 1 comprising a second conductive line positioned in the display area, extending parrallel to the first conductive line, electrically isolated from the first conductive line, and electrically connected to at least one of the pixels, wherein the first conductive line is postioned between the first hole and the second conductive line.

11. The display device of claim 10 comprising a third condutive line intersecting each of the first condutive line and the second conductive line, electrically isolated from each of the first conductive line and the second conductive line, and electrically conencted to some of the pixels, wherein the first conductive member has a second hole, wherein the second hole has a form of a second numeral, wherein the second numeral represents a second number in the range of 2 to 9, and wherein the third conductive line is positioned between the first hole and the second hole.

12. The display device of claim 1 comprising:
    a second conductive line intersecting the first conductive line, electrically isolated from the first conductive line, and electrically connected to at least one of the pixels;
    a second conductive member, wherein a material of the second conductive member is identical to a material of the second conductive line, and wherein the second conductive member partially covers the first hole and partially exposes the first hole.

13. The display device of claim 12, wherein the first conductive line extends in a first direction, and wherein a width of the second conductive line in the first direction is smaller than a dimension of the first hole in the first direction.

14. The display device of claim 12, wherein the first conductive member has a second hole, wherein the second hole has a form of a second numeral, wherein the second numeral represents a second number in the range of 2 to 9, and wherein the second conductive line is positioned between the first hole and the second hole.

15. The display device of claim 14, wherein the second number neighbors the first number with no intervening hole of the first conductive member being positioned between the first hole and the second hole, and wherein a difference between the first number and the second number is 0 or 1.

16. The display device of claim 14, wherein one of the first number and the second number represents a digit of an identification number of the second conductive line.

17. A method for manufacturing a display device, the method comprising:
preparing a substrate, the substrate comprising a display area and a non-display area, the non-display area abutting the display area;
preparing a plurality of pixels, the pixels being positioned on the display area for displaying an image;
preparing a first conductive line, the first conductive line being positioned on the display area and being electrically connected to one or more of the pixels; and
preparing a second conductive line, the second conductive line intersecting the first conductive line, being electrically isolated from the first conductive line, and being electrically connected to at least one of the pixels;
forming a first hole in a first conductive member, wherein the first conductive member is electrically connected to the first conductive line, wherein the first conductive member is positioned on the non-display area, wherein a material of the first conductive member is identical to a material of the first conductive line, wherein the first hole has a form of a first numeral, and wherein the first numeral represents a first number in a range of 2 to 9; and
forming the first hole for the first number to be equal to a first digit of an identification number of the first conductive line or a first digit of an identification number of the second conductive line.

18. The method of claim 17 comprising:
forming a second hole in the first conductive member, wherein the second hole has a form of a second numeral, and wherein the second numeral represents a second number in the range of 2 to 9; and
forming the second hole for the second number to be equal to a second digit of the identification number of the first conductive line or a second digit of the identification number of the second conductive line.

19. The method of claim 17 comprising:
forming a second hole in a second conductive member, the second conductive member being positioned on the non-display area, wherein a material of the second conductive member is identical to the material of the first conductive line, wherein the second hole has a form of a second numeral, and wherein the second numeral represents a second number in the range of 2 to 9; and forming the second hole for the second number to be equal to a second digit of the identification number of the first conductive line or a second digit of the identification number of the second conductive line.

20. A method for manufacturing a display device, the method comprising:
preparing a substrate, the substrate comprising a display area and a non-display area, the non-display area abutting the display area;
preparing a plurality of pixels, the pixels being positioned on the display area for displaying an image;
preparing a plurality of first-type conductive lines, the first-type conductive lines being positioned on the display area and being electrically connected to the pixels; and
preparing a plurality of second-type conductive lines, the second-type conductive lines intersecting the first-type conductive lines, being electrically isolated from the first-type conductive lines, and being electrically connected to the pixels;
forming a first hole in a first conductive member, wherein the first conductive member is positioned on the non-display area, wherein a material of the first conductive member is identical to a material of the first-type conductive lines, wherein the first hole has a form of directional symbol; and
forming the first hole for the directional symbol to indicate an increasing direction or a decreasing direction of identification numbers of the first-type conductive lines or of identification numbers of the second-type conductive lines.

21. A display device comprising:
a substrate comprising a display area and a non-display area, the non-display area abutting the display area;
a common voltage wiring disposed on the non-display area;
a plurality of pixels positioned on the display area for displaying an image;
a first conductive line positioned on the display area and electrically connected to one or more of the pixels; and
a first conductive member positioned on the non-display area,
wherein the common voltage wiring has a first hole having an edge in the form representing a first numeral,
wherein a material of the first conductive member is identical to a material of the first conductive line,
wherein the first hole has a form of a first numeral, and
wherein the first numeral represents a first number in a range of 2 to 9.

* * * * *